United States Patent [19]
Richards

[11] Patent Number: 5,606,294
[45] Date of Patent: Feb. 25, 1997

[54] AUTOMATIC GAIN CONTROL CIRCUIT AND METHOD

[75] Inventor: Roy Richards, Los Altos, Calif.

[73] Assignee: IC Works, Inc., San Jose, Calif.

[21] Appl. No.: 593,748

[22] Filed: Jan. 29, 1996

[51] Int. Cl.$^6$ ............................. H03B 5/12; H03B 5/18
[52] U.S. Cl. ............... 331/109; 331/74; 331/108 C; 331/117 R; 331/175; 331/177 V; 331/183; 331/186
[58] Field of Search ............... 331/74, 77, 108 C, 331/109, 116 R, 116 FE, 117 R, 117 FE, 117 D, 175, 177 V, 183, 186

[56] References Cited

U.S. PATENT DOCUMENTS 4,609,884  9/1986  Kindinger et al. ............... 331/109

*Primary Examiner*—David Mis
*Attorney, Agent, or Firm*—Oblon, Spivak, McClelland, Maier & Neustadt, P.C.

[57] ABSTRACT

An automatic gain control circuit and method ensure feedback for oscillator circuitry fabricated on a single semiconductor chip to adapt to the Q value established by a resonator circuit connected to the oscillator circuitry, and to ensure that gain is maximized and linearity of operation preserved within the voltage rails of the power supply.

10 Claims, 2 Drawing Sheets

AUTOMATIC GAIN CONTROL CIRCUIT AND METHOD

FIELD OF INVENTION

This invention relates generally automatic gain control (AGC) circuits and methods and particularly AGC circuits and methods used with oscillator circuitry.

BACKGROUND OF THE INVENTION

Oscillator circuitry is employed for radio frequency applications of many kinds, including cellular telephones, data communications networks, cordless telephones, local area networks (LAN), wireless LAN systems, wireless wide area networks (WAN), and private branch exchange (PBX) applications, for example. Oscillator circuitry operates stably and linearly within the limits of supply voltage rails.

To maximize gain while operating within the linear region of the oscillator circuitry requires setting the resonant operation of oscillator circuitry to operate substantially fully within the positive and negative voltage rails of the supply, without exceeding these limits to any substantial extent. This limits the amount of distortion suffered during oscillator operation. As is well-known, the resonator circuit of an oscillator circuitry can be characterized according to its "Q" value.

It is accordingly desirable to develop a universal integrated circuit or IC that would accept adaptively any of a number of different resonator circuits having any of a range of particular characteristics.

At present, the designer for an oscillator circuit provides for manual setting of transistor bias levels which permit exact mating with a particular resonator circuit. As a result, after fabrication, the particular oscillator circuit designed mates well with the particular resonator for which it has been designed and correctly sets the bias values for the anticipated resonator with which it has been designed to operate, but generally is incapable of adaptive coordination with other resonators which may be substituted for the originally anticipated resonator.

SUMMARY OF THE INVENTION

According to the present invention, an indication of the output oscillation amplitude of an oscillator circuit is made, and a measure of that indication is fed back to compensate for any deviation between a desired amplitude level and the actual level of the indication. This ensures maximum linearity from the voltage controlled oscillator or an oscillator in general.

According to the present invention, compatibility is established for particular integrated circuit oscillator circuitry for a range of different resonator circuits with which connection can be anticipated in an operational environment. Such different resonator circuits can include strip line resonators, ceramic resonators, or inductors, to mention some resonators which may be connected with oscillator circuitry fabricated on a semiconductor chip. Such different kinds of resonators have very different Q values and different circuit characteristics.

Accordingly, the present invention provides an oscillator capable of compatible operation with any of a number of resonator circuits with which it may be connected for operation, ensuring its ability to perform substantially rail to rail at minimal distortion consistent with high gain, linear region performance. Further, the present invention obviates having to expend additional energy during the operation of an oscillator circuit to reach the excursion limitations of the voltage rails, when an unduly low Q value of a particular resonator does not itself drive the oscillator circuitry operation to near the rail limits.

Further, according to the present invention, an automatic gain control circuit and method ensure feedback are provided for oscillator circuitry fabricated on a single semiconductor chip to adapt to the Q value established by a resonator circuit connected to the oscillator circuitry, and to ensure that gain is maximized and linearity of operation preserved within the voltage rails of the power supply.

DESCRIPTION OF THE PREFERRED EMBODIMENT

Figure 1:
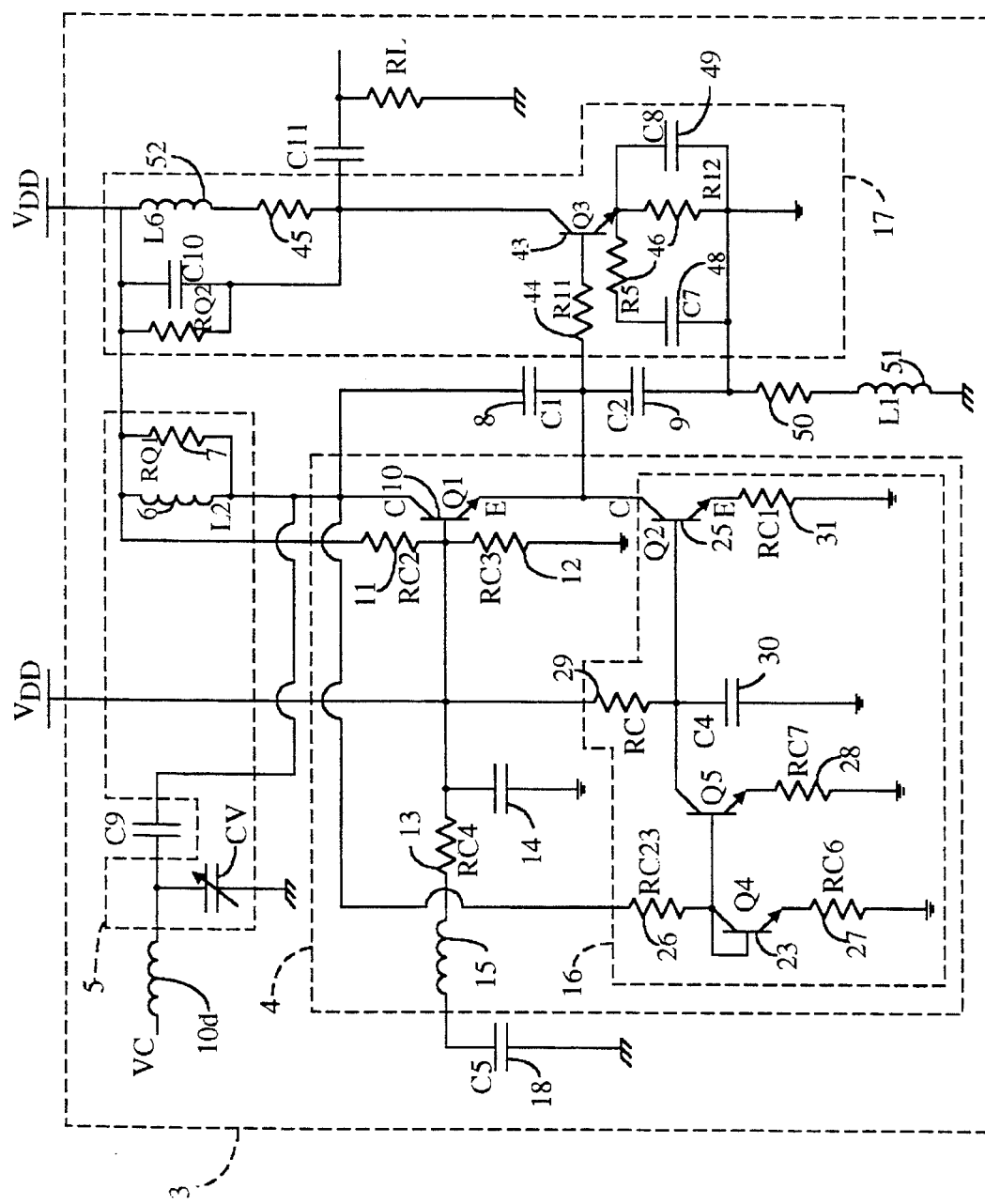
FIG. 1 is a circuit diagram of an adaptive oscillator circuit including an automatic gain control circuit according to the present invention for adjusting to resonator circuits having a range of circuit configurations and Q values.

FIG. 1 is a circuit diagram of an adaptive oscillator circuit 3 including an automatic gain control circuit 4 according to the present invention for adjusting to a resonator circuit 5 (i.e., "tank circuit") which may have a range of circuit configurations and Q values. The output node of adaptive oscillator circuit 3 is the collector of transistor 43 (Q3). DC isolation capacitor C11 and load resistor RL are connected in series as the output load of adaptive oscillator circuit 3. Capacitor C9 provides DC isolation at the input of adaptive oscillator circuit 3.

As will be seen, the gain of the adaptive oscillator circuit 3 will track the Q of a selected resonator circuit 5 to ensure that output voltage swings are substantially undeformed. This is ensured by allowing the output voltage to swing substantially rail to rail, without urging excessive swings which might deform the signal.

Figure 2:
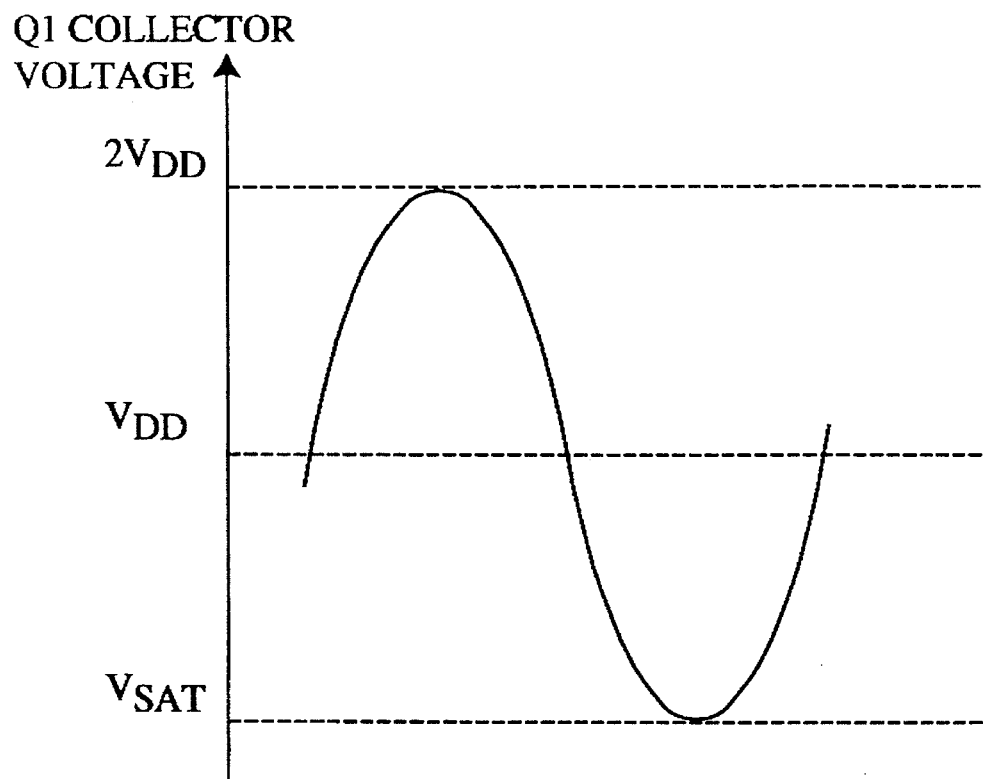
FIG. 2 is a diagram of an output voltage signal from the oscillator circuitry according to the present invention.
Figure 3:
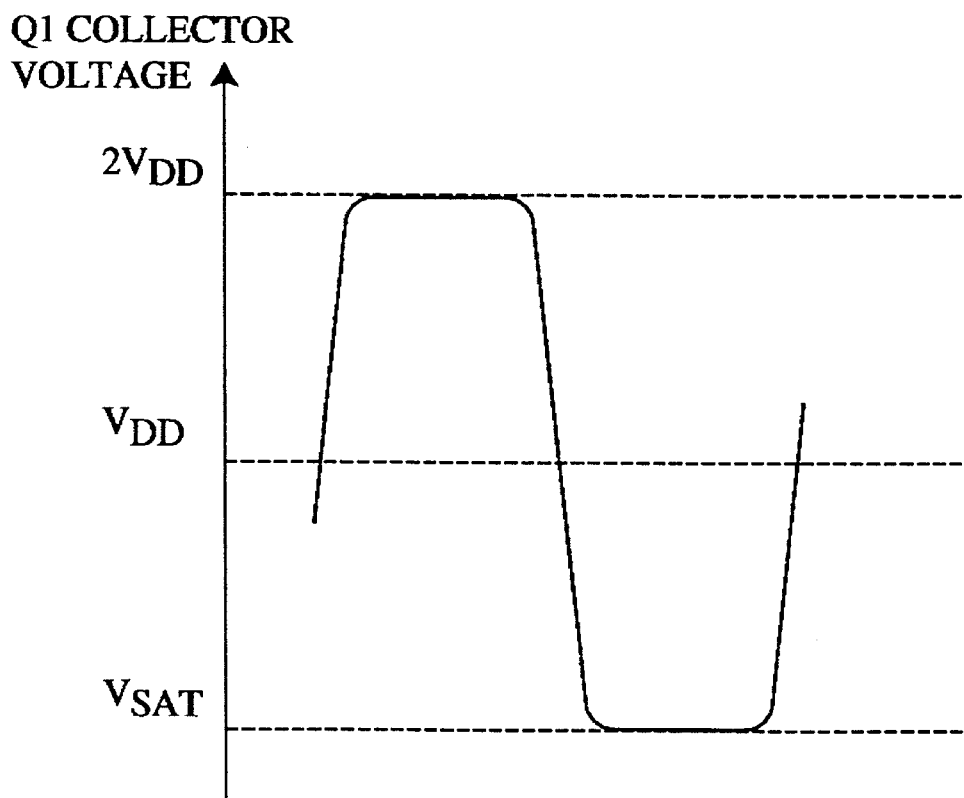
FIG. 3 is a diagram of an output voltage signal from the oscillator circuitry according to the prior art, in which non-linearity of output is attained.

FIG. 2 shows a desirable, substantially undeformed sinusoidal output voltage swing between saturation and twice VDD in response to an undeformed input voltage signal VC at the input of inductor 10d connected to variable capacitor 6'. FIG. 3 shows an unacceptably deformed output voltage curve as a result of excessive gain for a particular tank Q level.

Substantial non-tank circuit portions of adaptive oscillator circuit 3 and automatic gain control circuit 4 in FIG. 1 are on a single semiconductor chip, according to one embodiment of the present invention.

Resonator circuit 5 shown in FIG. 1 is one configuration of a tank circuit which can be employed with oscillator circuit 3 and automatic gain control circuit 4, according to the present invention. In particular, resonator circuit 5 may include an inductor 6 (L2) and a variable capacitor 6', i.e., a varactor 6'. L2 can be a selected inductor, whether ceramic, resonant or stripline, or a discrete lumped inductor depending on desired operational frequency.

Inductor 6 is shown in FIG. 1 having an internal resistance in parallel therewith as resistor 7 (RQ1), and first and second capacitors 8 and 9 respectively C1 and C2, which are connected in series with each other along a path leading to ground. The Q of resonator circuit 5 is determined by L2 and a composite capacitance established by CV in parallel with C1 and C2. CV, according to one embodiment, is manually adjustable, to establish a desired Q level in connection with L2. C2 is grounded externally through a contact having electrical characteristics of a resistor 50 in series with an inductor 51 (L1).

According to one version of the present invention, capacitor C1 is connected to both inductor 6 and resistor 7 (representing the internal resistance of inductor 6).

Resonator circuit 5 in FIG. 1 determines frequency of operation for adaptive oscillator circuit 3, depending upon the value of inductor 6. Capacitors C1 and C2 are generally fabricated on the same semiconductor chip as are most of the circuitry of adaptive oscillator circuit 3, but according to another embodiment C1 and C2 could be discrete or off-chip components.

Adaptive oscillator circuit 3 in FIG. 1 includes transistor 10 (Q1) having base, collector, and emitter connections. This transistor, Q1, is the primary oscillator transistor which controls the output voltages of adaptive oscillator circuit 3.

For AC purposes, the base of transistor 10 in FIG. 1 is grounded.

Transistor 10 in FIG. 1 sets the gain of oscillator circuit 3. Oscillator circuit 3 further includes resistors 11 and 12 respectively RC2 and RC3, resistor 13 (RC4), capacitor 14 (C3), inductor 15 (L8), feedback circuit 16, and output circuit 17.

Resistors 11 and 12 (respectively RC2 and RC3) and capacitor 14 in FIG. 1 are connected to the base of transistor 10. Resistor 11 is futher connected to inductor 6 and resistor 7. Additionally, resistor 12 and capacitor 14 are connected to ground or common. Resistor 13 is connected to inductor 15 and a ground-connected capacitor 18. Capacitor 18 is off the semiconductor chip according to one version of the present invention, because of its large value. Accordingly, the base of transistor 10 is grounded through resistor 13, inductor 15, and capacitor 18 to ensure its base is a quiet node. Inductor 15 represents the wire bond of the semiconductor package, according to one embodiment of the present invention, thus serving as a parasitic inductance. Resistor 13 is the parasitic resistance of the same package at the indicated point. According to an embodiment of the present invention, oscillator circuit 3 is fabricated in a small shrink surface mount plastic package, i.e., a SSOP.

Feedback circuit 16 in FIG. 1 includes transistors 23, 24, and 25, respectively Q4, Q5, and Q2.

Transistor 23 in FIG. 1 contributes to rectification of the feedback signal received. Transistor 24 amplifies the feedback signal. The feedback signal carried by feedback circuit 16 is indicative of the voltage level between capacitors C1 and C2.

Transistor 25 (Q2) in FIG. 1 controls the bias level for transistor 10, which in turn establishes the gain of transistor 10.

Feedback circuit 16 in FIG. 1 further includes resistors 26, 27, 28, and 29, respectively RC23, RC6, RC7, and RC. Feedback circuit 16 further includes capacitor 30 (C4) and resistor 31 (RC1). Transistors Q4 and Q5 act as a current mirror, ensuring that the current passing through resistor 28 mirrors that passing through resistor 27. In other words, the respective currents in the respective resistors correspond linearly.

Transistor 25 (Q2) in FIG. 1 is connected to the emitter of transistor 10 (Q1) and to capacitors 8 and 9. The emitter of transistor 25 (Q2) is connected to ground through resistor 31. The base of transistor 25 (Q2) is connected to the collector of transistor 24. Resistors 26 and 27 are connected respectively to capacitor 8 and ground.

The base and collector of transistor 23 (Q5) in FIG. 1 are connected to each other and to the base of transistor 24. Resistor 28 is connected to the emitter of transistor 24, and the collector of transistor 24 is connected to resistor 29, capacitor 30, and the base of transistor 25 (Q2). Resistor 29 is further connected to $V_{DD}$.

Accordingly, feedback circuit 16 in FIG. 1 feeds back the signal at the a feedback node which is the junction of capacitor C1, capacitor C2, resistor R11, and the emitter of transistor Q1.

The amplitude of the feedback node signal in FIG. 1 is fed back from the node and controls the bias in transistor Q1 to ensure that transistor Q1 has just enough gain to produce a linear output at the base of transistor Q3. Thus, a sine wave at the node between capacitors C1 and C2 is rectified and filtered at transistor Q4.

Transistor Q5 in FIG. 1 provides a degree of amplification. Further, capacitor C4 is charged by resistor 29, i.e., resistor RC. This sets the DC level at the base of transistor Q2, which in turn sets the bias for transistor Q 1. In short, capacitor C4 is charged by resistor 29 and discharged by transistor Q5. Accordingly, turning on transistor Q5 intermittently for the same period more often per second, causes discharge of capacitor C4, and reduces the bias on transistor Q2, which in turn reduces the gain on transistor Q1.

Capacitor C4 in FIG. 1 provides a predetermined level of filtering to produce a DC potential at the base of transistor Q2. The higher the DC potential at the base of transistor Q2 is, the higher the bias current will be on transistor Q1.

Output circuit 17 in FIG. 1 includes transistor 43 (Q3), resistor 44 (R11), resistor 45, resistor 46 (R5), resistor 47 (R12), capacitor 48 (C7), capacitor 49 (C8), resistor 50, and inductors 51 (L1) and 52 (L6). Transistor 43 is essentially a current amplifier acting as an output buffer. Transistor 43 is connected at its base to resistor 44 which in turn is connected to both capacitors 8 and 9. The collector of resistor 44 is connected to both resistors 46 and 47. Capacitor 48 is connected in series with resistor 46 to resistor 50 and in turn to inductor 51 which is connected to ground. Capacitor 49 is connected in parallel to resistor 47 and to ground.

Inductor 52 in FIG. 1 is a tank resonator for the output of oscillator circuit 3, enabling increased output gain from oscillator circuit 3 by permitting the collector of transistor Q3 to be driven over $V_{DD}$. Resistor 45 represents a parasitic resistance associated with inductor L6.

Capacitor C11 in FIG. 1 is an AC coupling or DC blocking capacitor at the output of transistor Q3 which is connected to a selected load, $R_L$. Resistor R12 sets the bias level in transistor Q3, to ensure that amplifier operation remains in the linear region with optimal gain. Capacitor C8 in parallel with resistor R12 increases amplifier gain produced by transistor Q3. Resistor R5 and capacitor C7 act as a compensation circuit. Resistor R12, according to one embodiment of the present invention is on the order of 10 or 20 Ohms. Resistor R5 is substantially greater. Capacitor C7 is a feedback compensation capacitor ensuring that transistor Q3 remains stable during operation.

Inductor L1 in FIG. 1 is a parasitic inductance and resistor 50 is a parasitic resistance associated with a connection of capacitor C2 external to the semiconductor chip on which capacitor C2 is fabricated. These parasitic elements represent the circuit effects of the packaging for the chip in which oscillator circuit 3 is fabricated.

Inductor 10d at the input of oscillator circuit 3 in FIG. 1 is the control input of oscillator circuit 3 for receiving a DC control voltage which sets the frequency of oscillation of oscillator circuit 3.

Inductor 10d in FIG. 1 is connected to a variable capacitor 10a and a fixed capacitance 10b which is connected to the emitter of transistor 10. Capacitor C9 isolates the DC value of the collector of transistor Q1 from the reactor diode, because DC voltages at the collector of transistor Q1 would impact the frequency of oscillator circuit 3.

FIG. 2 is a diagram of an output voltage signal of the oscillator circuitry according to the present invention at the collector of transistor Q1. In particular, the output voltage signal is a substantially undistorted sinusoidal waveform swinging from $V_{SAT}$ through $V_{DD}$ to a level of 2 $V_{DD}$.

FIG. 3 is a diagram of an output voltage signal from the oscillator circuitry according to the prior art, in which non-linearity of output is attained. As shown, the peaks and valleys of the output signal are distorted and squared off in non-linear fashion due to transistor Q1 entering saturation, even though an undistorted sinusoidal waveform is the driving input.

What is claimed is:

1. An automatic gain control circuit for adapting to a selected resonator circuit, comprising:
    an AC base-grounded transistor including a feedback node and a bias node, said AC base-grounded transistor driving a selected resonator circuit connected between said bias and feedback nodes; and
    a feedback circuit for detecting voltages at said feedback node and producing bias signals for said AC base-grounded transistor at its bias node in response to voltages detected at said feedback node.

2. The automatic gain control circuit according to claim 1 wherein said feedback circuit includes a bias transistor circuit for biasing said AC base-grounded transistor at said bias node.

3. The automatic gain control circuit according to claim 1 wherein said feedback circuit includes a current mirror circuit for transmitting an indication of the voltage signal at the bias node of said AC base-grounded transistor.

4. The automatic gain control circuit according to claim 3 wherein said current mirror circuit includes a transistor configured as a diode.

5. The automatic gain control circuit according to claim 1 wherein said feedback circuit includes a bias transistor connected to said bias node, said bias transistor including a base, a collector, and an emitter.

6. The automatic gain control circuit according to claim 5 further comprising a smoothing capacitor connected to the base of said bias transistor.

7. The automatic gain control circuit according to claim 3 wherein said current mirror circuit includes a transistor in turn including base, collector, and emitter connections.

8. The automatic gain control circuit according to claim 7 wherein said base and emitter are connected to each other.

9. The automatic gain control circuit according to claim 7 wherein said current mirror circuit includes a first and second resistors respectively connected to ground and to said feedback node.

10. An automatic gain control method for driving a selected resonator circuit having an AC base-grounded transistor including a feedback node and a bias node, comprising:
    detecting voltages at the feedback node of a selected resonator circuit; and
    providing a bias signal responsive to the voltages detected at the feedback node to modify corresponding voltages of said selected resonator circuit at said bias node in response to the voltages detected at said feedback node.

* * * * *